(12) United States Patent
Yoon et al.

(10) Patent No.: US 10,963,109 B2
(45) Date of Patent: Mar. 30, 2021

(54) CONDUCTIVE STRUCTURE AND MANUFACTURING METHOD THEREFOR

(71) Applicant: LG CHEM, LTD., Seoul (KR)

(72) Inventors: Junghwan Yoon, Daejeon (KR); Doohoon Song, Daejeon (KR); Song Ho Jang, Daejeon (KR); Jin Woo Park, Daejeon (KR); Ki-Hwan Kim, Daejeon (KR)

(73) Assignee: LG CHEM LTD., Seoul (KR)

( * ) Notice: Subject to any disclaimer, the term of this patent is extended or adjusted under 35 U.S.C. 154(b) by 238 days.

(21) Appl. No.: 15/556,883

(22) PCT Filed: Aug. 11, 2016

(86) PCT No.: PCT/KR2016/008834
§ 371 (c)(1),
(2) Date: Sep. 8, 2017

(87) PCT Pub. No.: WO2017/026812
PCT Pub. Date: Feb. 16, 2017

(65) Prior Publication Data
US 2018/0018043 A1  Jan. 18, 2018

(30) Foreign Application Priority Data
Aug. 13, 2015 (KR) .................. 10-2015-0114720

(51) Int. Cl.
| | | |
|---|---|---|
| *G06F 3/041* | (2006.01) | |
| *G06F 3/044* | (2006.01) | |
| *C23C 14/08* | (2006.01) | |
| *C23C 14/20* | (2006.01) | |

(52) U.S. Cl.
CPC .......... *G06F 3/0443* (2019.05); *C23C 14/087* (2013.01); *C23C 14/20* (2013.01); *G06F 3/041* (2013.01); *G06F 2203/04103* (2013.01); *G06F 2203/04112* (2013.01)

(58) Field of Classification Search
None
See application file for complete search history.

(56) References Cited

U.S. PATENT DOCUMENTS

| | | | | |
|---|---|---|---|---|
| 5,942,349 | A | * | 8/1999 | Badwal ............... H01M 8/0208 427/115 |
| 9,706,653 | B2 | | 7/2017 | Yoon et al. |
| 2007/0154561 | A1 | | 7/2007 | Takeda et al. |
| 2013/0104973 | A1 | | 5/2013 | Jee et al. |

(Continued)

FOREIGN PATENT DOCUMENTS

| | | |
|---|---|---|
| CN | 1922104 A | 2/2007 |
| CN | 104425416 A | 3/2015 |

(Continued)

*Primary Examiner* — Callie E Shosho
*Assistant Examiner* — Daniel D Lowrey
(74) *Attorney, Agent, or Firm* — Dentons US LLP (57) ABSTRACT

The present application relates to a conductive structure body and a method for manufacturing the same. A conductive structure body according to an exemplary embodiment of the present application comprises a substrate; a metal layer provided on the substrate; and a light reflection reducing layer provided on at least one surface of the metal layer and comprising copper-manganese-nickel oxide.

11 Claims, 6 Drawing Sheets

(56) References Cited

U.S. PATENT DOCUMENTS

| | | | |
|---|---|---|---|
| 2013/0206227 A1 | 8/2013 | Shimizu et al. | |
| 2014/0251429 A1 | 9/2014 | Lim et al. | |
| 2015/0373844 A1 | 12/2015 | Yoon et al. | |
| 2016/0231650 A1 | 3/2016 | Stoessel et al. | |

FOREIGN PATENT DOCUMENTS

| | | |
|---|---|---|
| JP | 2004246241 A | 9/2004 |
| KR | 2013-0045568 A | 5/2013 |
| KR | 10-1306563 B1 | 9/2013 |
| KR | 2013-0129187 A | 11/2013 |
| KR | 2015-0051915 A | 5/2015 |
| WO | 2015-046018 A1 | 4/2015 |

\* cited by examiner

<Before Heat Resistance Test>

<After Heat Resistance Test>

CONDUCTIVE STRUCTURE AND MANUFACTURING METHOD THEREFOR

TECHNICAL FIELD

This application is a National Stage Entry of International Application No. PCT/KR2016/008834 filed on Aug. 11, 2016, and claims the benefit of Korean Application No. 10-2015-0114720 filed on Aug. 13, 2015, all of which are hereby incorporated by reference in their entirety for all purposes as if fully set forth herein.

The present application relates to a conductive structure body and a method for manufacturing the same.

BACKGROUND ART

In general, touch screen panels may be classified as follows according to a signal detection type. That is, there are a resistive type that detects a position pressed by pressure through a change in a current or voltage value while DC voltage is applied, a capacitive type using capacitance coupling while AC voltage is applied, an electromagnetic type that detects a selected position as a change in voltage while a magnetic field is applied, and the like.

Recently, as a need for a large-area touch screen panel is increased, development of technologies capable of implementing large touch screen panels having excellent visibility while reducing resistance of electrodes is required.

DETAILED DESCRIPTION OF THE INVENTION

Technical Problem

The present application has been made in an effort to provide a conductive structure body capable of being applied to a large-area touch panel, minimizing deterioration of performance in durability such as heat resistance, salt water resistance, high temperature and high humidity environments, and reducing light reflection of the conductive pattern while minimizing an influence on the conductivity of the conductive pattern.

Technical Solution

An exemplary embodiment of the present application provides a conductive structure body comprising: a substrate; a metal layer provided on the substrate; and a light reflection reducing layer provided on at least one surface of the metal layer and comprising copper-manganese-nickel oxide, in which the copper content is 28 to 46 at %, the manganese content is 3 to 12 at %, the nickel content is 17 to 24 at %, and the oxygen content is 18 to 52 at % in the light reflection reducing layer.

Another exemplary embodiment of the present application provides a method for manufacturing a conductive structure body, the method comprising: forming a metal layer on a substrate; and forming a light reflection reducing layer provided on at least one surface of the metal layer and comprising copper-manganese-nickel oxide, in which the copper content is 28 to 46 at %, the manganese content is 3 to 12 at %, the nickel content is 17 to 24 at %, and the oxygen content is 18 to 52 at % in the light reflection reducing layer.

Still another exemplary embodiment of the present application provides a touch screen panel comprising the conductive structure body.

Yet another exemplary embodiment of the present application provides a display device comprising the touch screen panel.

Advantageous Effects

According to the exemplary embodiment of the present application, the conductive structure body has advantages of maintaining excellent electric conductivity and efficiently preventing a glaring effect of the metal layer. Further, the conductive structure body according to the exemplary embodiment of the present application has advantages of having excellent visibility and excellent chemical durability and physical durability.

Further, the conductive structure body according to the exemplary embodiment of the present application can minimize deterioration of electric conductivity of the conductive structure body according to a process environment in the case of being applied to an electronic device such as a display device. Further, the conductive structure body according to the exemplary embodiment of the present specification may implement a fine line width and improve visibility.

Therefore, the conductive structure body according to the exemplary embodiment of the present application does not influence the conductivity of the metal layer and may prevent reflection by the metal layer and improve concealment of the metal layer by improving absorbance. Further, it is possible to develop touch screen panels with improved visibility, and display devices and solar cells using the same by using the conductive structure body according to the exemplary embodiment of the present application.

EXPLANATION OF REFERENCE NUMERALS
AND SYMBOLS

100: Substrate
200: Light reflection reducing layer
220: Light reflection reducing layer
300: Metal layer
201: Light reflection reducing pattern layer
221: Second light reflection reducing pattern layer
301: Metal pattern layer

BEST MODE

In this application, it will be understood that when a member is referred to as being "on" another member, it can be directly on the other member or intervening members may also be present.

Throughout the application, unless explicitly described to the contrary, the word "comprise" and variations such as "comprises" or "comprising" will be understood to imply the inclusion of stated elements but not the exclusion of any other elements.

Hereinafter, the present application will be described in more detail.

In this specification, a display device collectively refers to a TV, a computer monitor, or the like and comprises a display element forming images and a case supporting the display element.

As the display element, a plasma display panel (PDP), a liquid crystal display (LCD), an electrophoretic display, a cathode-ray tube (CRT), an OLED display, and the like may be exemplified. In the display element. RGB pixel patterns and additional optical filters for implementing the image may be provided.

Meanwhile, with respect to the display device, as distribution of smart phones, tablet PCs, IPTVs, and the like is accelerated, a need for a touch function in which a human's hand becomes a direct input device without a separate input device such as a keyboard or a remote controller has gradually increased. Further, a multi-touch function capable of handwriting as well as specific point recognition has been required.

Currently, most of the commercialized touch screen panels (TSPs) are based on transparent conductive ITO thin films, but at the time of applying the large-area touch screen panel, there are problems in that a touch recognition speed is decreased because of RC relay due to a relatively high surface resistance (a minimum of 150 Ω/sq, ELECRYSTA product manufactured by Nitto Denko Corporation) of an ITO transparent electrode itself and an additional compensation chip for overcoming the problem needs to be introduced.

The present inventors of the present application studied a technology for replacing the transparent ITO thin film with a metal fine pattern having a surface resistance value of several Ω/sq. As a result, the present inventors of the present application found that in the case of using Ag, Mo/Al/Mo, Ma/Ti/Cu, or the like which is a metal thin film having high electric conductivity as an electrode use of the touch screen panel, when a fine electrode pattern having a specific shape is implemented, due to high reflectivity, in terms of visibility, there is a problem in that the pattern is well viewed by the human eye, and due to high reflectivity, a high haze value, and the like against external light, there is a problem in that glaring and the like may occur.

The inventors of the present application found the fact that in a touch screen panel comprising a conductive metal fine pattern provided on an effective screen portion, light reflective and diffractive characteristics caused by the pattern layer have an important effect on the visibility of the conductive metal fine pattern and intend to improve the fact. In particular, The inventors of the present application found that in an existing ITO-based touch screen panel, due to high transmittance of ITO itself, the problem caused by the reflectivity of the conductive pattern is not greatly shown, but in the touch screen panel comprising the conductive metal fine pattern provided in the effective screen portion, reflectivity and light-reflection reduction characteristics of the conductive metal fine pattern are important.

In order to solve the above problems, the present application provides a conductive structure body which may be differentiated from a touch screen panel using a conventional ITO-based transparent conductive thin film layer and has improved concealment of the metal fine pattern electrode and improved reflective and diffractive characteristics for external light. Furthermore, when a conductive laminate according to an exemplary embodiment of the present application is applied to a display unit of an electronic device such as a touch screen panel, excellent conductivity and visibility may be ensured.

In the present specification, the "conductivity" means electric conductivity.

Further, in the present specification, the "reflection" means a light reflection, a "refractive index" means a light refractive index, and an absorptance means a light absorptance.

A conductive structure body according to an exemplary embodiment of the present application comprises a substrate; a metal layer provided on the substrate; and a light reflection reducing layer provided on at least one surface of the metal layer and comprising copper-manganese-nickel oxide, in which the copper content is 10 to 50 at %, the manganese content is 0.1 to 16 at %, the nickel content is 0.1 to 28 at %, and the oxygen content is 30 to 80 at % in the light reflection reducing layer.

In the exemplary embodiment of the present application, a ratio of the oxygen content to the sum of the copper, manganese, nickel, and oxygen contents in the light reflection reducing layer may be 0.18 to 0.52.

When the ratio of the oxygen content to the sum of the copper, manganese, nickel, and oxygen contents in the light reflection reducing layer is 0.18 to 0.52, the light reflection reducing layer may have a stably low reflection. Further, when the ratio of the oxygen content to the sum of the copper, manganese, nickel, and oxygen contents in the light reflection reducing layer is 0.18 to 0.52, the light reflection reducing layer has excellent physical durability and chemical durability and thus, deterioration of performance may be minimized.

When the ratio of the oxygen content to the sum of the copper, manganese, nickel, and oxygen contents in the light reflection reducing layer is 0.18 to 0.52, etching for patterning the light reflection reducing layer may be easily performed. That is, when the ratio of the oxygen content to the sum of the copper, manganese, nickel, and oxygen contents in the light reflection reducing layer is beyond 0.18 to 0.52, an etching property is deteriorated and thus, there is a problem in that it is difficult to pattern the light reflection reducing layer and further, there may be problem in that batch etching with the metal layer is difficult.

In the exemplary embodiment of the present application, the light reflection reducing layer may be formed by a deposition process under an oxygen atmosphere using a source material of each of Cu, Mn, and Ni and formed by a deposition process under an oxygen atmosphere using a Cu source material containing Mn and Ni.

In the exemplary embodiment of the present application, the light reflection reducing layer may be a patterned light reflection reducing pattern layer. Further, the metal layer may be a patterned metal pattern layer. The light reflection reducing layer may be patterned simultaneously with or separately from the metal layer.

In the exemplary embodiment of the present application, the light reflection reducing layer may be provided on at least one surface of the metal layer. More particularly, the light reflection reducing layer may be provided on only any one surface of the metal layer or provided on both surfaces of the metal layer.

In the exemplary embodiment of the present application, the metal layer may be provided between the substrate and the light reflection reducing layer. More particularly, the conductive structure body may comprise a substrate; a metal layer provided on the substrate; and a light reflection reducing layer provided on the metal layer.

In the exemplary embodiment of the present application, the light reflection reducing layers may be provided between the substrate and the metal layer. Particularly, the conductive structure body may comprise a substrate; a light reflection reducing layer provided on the substrate; and a metal layer provided on the light reflection reducing layer.

The inventors of the present application found the fact that in a touch screen panel comprising a conductive metal fine pattern provided on an effective screen portion, light reflective and diffractive characteristics caused by the pattern layer have an important effect on the visibility of the conductive metal fine pattern and intend to improve the fact. In particular, The inventors of the present application found that in an existing ITO-based touch screen panel, due to high transmittance of ITO itself, the problem caused by the reflectivity of the conductive pattern is not greatly shown, but in the touch screen panel comprising the conductive metal fine pattern in the effective screen portion, reflectivity and light-reflection reduction characteristics of the conductive metal fine pattern are important.

In a touch screen panel according to an exemplary embodiment of the present application, in order to reduce reflectivity of a conductive metal fine pattern and improve an absorbance characteristic, a light reflection reducing layer may be introduced. The light reflection reducing layer is provided on at least one surface of the conductive layer in the touch screen panel, thereby largely improving a visibility deterioration problem according to high reflectivity of the conductive layer.

Particularly, the light reflection reducing layer reduces amounts of light incident to the conductive layer itself and light reflected from the conductive layer due to absorption, thereby lowering the reflectivity by the conductive layer. Further, the light reflection reducing layer may have low reflectivity compared with the conductive layer. As a result, the reflectivity of the light may be lowered as compared with a case where a user directly views the conductive layer, thereby largely improving the visibility of the conductive layer.

In this specification, the light reflection reducing layer means a layer that may reduce amounts of light incident to the metal layer itself and light reflected from the metal layer due to absorption and the light reflection reducing layer may be a patterned light reflection reducing pattern layer. The light reflection reducing layer may be expressed by terms such as a darkening layer, a light absorption layer, a blackening layer, and a blackness layer, and the patterned light reflection reducing pattern layer may be expressed by terms such as a darkening pattern layer, a light absorption pattern layer, a blackening pattern layer, and a blackness pattern layer.

In the exemplary embodiment of the present application, the surface resistance of the conductive structure body comprising the patterned metal layer and the patterned light reflection reducing layer may be 1 Ω/sq or more and 300 Ω/sq or less, particularly 1 Ω/sq or more and 100 Ω/sq or less, more particularly 1 Ω/sq or more and 50 Ω/sq or less, and much more particularly 1 Ω/sq or more and 20 Ω/sq or less.

If the surface resistance of the conductive structure body is 1 Ω/sq or more and 300 Ω/sq or less, there is an effect of replacing a conventional ITO transparent electrode. When the surface resistance of the conductive structure body is 1 Ω/sq or more and 100 Ω/sq or less or 1 Ω/sq or more and 50 Ω/sq or less, particularly, 1 Ω/sq or more and 20 Ω/sq or less, the surface resistance is significantly low as compared with the surface resistance when the conventional ITO transparent electrode is used. Thus, there are advantages in that when a signal is applied, the RC delay becomes shorter, and as a result, the touch recognition speed may be significantly improved and thus, a touch screen having a large area of 10 inches or more is easily applied.

In the conductive structure body, the surface resistance of the metal layer or the light reflection reducing layer before patterning may be more than 0 Ω/sq and 10 Ω/sq or less, more than 0 Ω/sq and 2 Ω/sq or less, and particularly more than 0 Ω/sq and 0.7 Ω/sq or less. When the surface resistance is 2 Ω/sq or less, particularly 0.7 Ω/sq or less, as the surface resistance of the metal layer or the light reflection reducing layer before pattering is lowered, a fine patterning design and a manufacturing process are easily performed, and the surface resistance of the conductive structure body after patterning is lowered and thus, there is an effect of increasing a reaction speed of the electrode. The surface resistance may be adjusted depending on a thickness of the metal layer or the light reflection reducing layer.

In the exemplary embodiment of the present application, in light having a wavelength of 380 nm or more and 780 nm or less, an extinction coefficient k of the light reflection reducing layer may be 0.6 or more and 1.4 or less and more particularly 0.8 or more and 1.4 or less. When the extinction coefficient is 0.6 or more and 1.4 or less, a reflection is further reduced and thus, the light reflection reduction of the light reflection reducing layer is further increased. In this case, the concealment of the metal layer is further improved and visibility may be further improved when the light reflection reducing layer is applied to the touch screen panel.

The extinction coefficient may be measured by using ellipsometer measuring equipment and the like which are known in the art.

It is preferred that the light reflection reducing layer is formed when the extinction coefficient k is 0.2 or more. The extinction coefficient k is also called an absorption coefficient and is an element of determining transmittance of the conductive structure body, as a measure capable of defining how strong the conductive structure body absorbs light in a predetermined wavelength. For example, in the case of a transparent dielectric material, when k<0.2, a k value is very small. However, as a metal component is increased in the material, the k value is increased. If the metal component is further increased, the material becomes a metal in which transmittance hardly occurs and only surface reflection mostly occurs, and the extinction coefficient k is more than 2.5 and thus, it is not preferred in the formation of the light reflection reducing layer.

In the exemplary embodiment of the present application, in light having a wavelength range of 380 nm or more and 780 nm or less, a refractive index n of the light reflection reducing layer may be 1.7 or more and 2.8 or less and more particularly 1.8 or more and 2.7 or less. Alternatively, more particularly, in light having a wavelength range of 500 nm or more and 680 nm or less, a refractive index n of the light reflection reducing layer may be 1.9 or more and 2.7 or less, and in light having a wavelength range of 550 nm or more and 680 nm or less, a refractive index n of the light reflection reducing layer may be 2 or more and 2.7 or less. Referring to Equation 2 below, a thickness of the light reflection reducing layer may be determined according to a refractive index.

$$d = \frac{\lambda}{4n} N (N = 1, 3, 5, \ldots)$$ [Equation 2]

In Equation 2, d is a thickness of the light reflection reducing layer, n is a refractive index, and λ is a wavelength of light.

In the exemplary embodiment of the present application, the total reflection of the conductive structure body may be 40% or less, 20% or less, particularly 15% or less, and more particularly 10% or less.

As the total reflection is smaller, the effect is better.

In the exemplary embodiment of the present application, the total reflection means a reflection to light having a wavelength range of 300 nm or more and 800 nm or less and particularly 380 nm or more and 780 nm or less, which is incident at 90° to the surface to be measured after an opposite surface to the surface to be measured is treated with perfect black. In the present specification, the total reflection is a value measured based on light having a wavelength range of 300 nm or more and 800 nm or less and particularly 380 nm or more and 780 nm or less of reflection light reflected by a target pattern layer or a conductive structure body to which the light is incident when incident light is 100%.

When the light reflection reducing layer is provided between the metal layer and the substrate, the reflection may be measured at the substrate side. When the total reflection is measured at the substrate side, the total reflection may be 20% or less, particularly 15% or less, and more particularly 10% or less. As the total reflection is smaller, the effect is better.

Further, when the metal layer is provided between the substrate and the light reflection reducing layer, the reflection may be measured in an opposite direction to a surface of the light reflection reducing layer contacting the metal layer. Particularly, when the light reflection reducing layer comprises a first surface contacting the metal layer and a second surface facing the first surface, the reflection may be measured in a direction of the second surface. When the total reflection is measured in the direction, the total reflection may be 20% or less, particularly 15% or less, and more particularly 10% or less. As the total reflection is smaller, the effect is better.

The metal layer may be a metal pattern layer and the light reflection reducing layer may be a light reflection reducing pattern layer. In this case, when the total reflection of the conductive structure body is measured at the second surface side of the light reflection reducing pattern layer, a total reflection Rt of the conductive structure body may be calculated by Equation 3 below.

Total reflection $Rt$=reflection of substrate+closure rate×reflection of light reflection reducing layer [Equation 3]

Further, when the conductive structure body is a configuration in which two types of conductive structure bodies are laminated, the total reflection Rt of the conductive structure body may be calculated by Equation 4 below.

Total reflection $Rt$=reflection of substrate+closure rate×reflection of light reflection reducing layer×2 [Equation 4]

In Equations 3 and 4 above, the total reflection of the substrate may be a reflection of touch tempered glass and when the surface is a film, the total reflection may be a reflection of the film.

Further, the closure rate may be represented by an area ratio, that is, (1—aperture ratio) occupied by a region covered by the conductive pattern based on a plane of the conductive structure body.

Accordingly, a difference between a case with the patterned light reflection reducing pattern layer and a case without the patterned light reflection reducing pattern layer depends on the reflection of the patterned light reflection reducing pattern layer. In this aspect, the total reflection Rt of the conductive structure body according to the exemplary embodiment of the present application may be decreased by 10 to 20%, 20 to 30%, 30 to 40%, 40 to 50%, and 50 to 70% as compared with a total reflection Ro of the conductive structure body having the same configuration except that there is no patterned light reflection reducing pattern layer. That is, in Equations 2 and 3 above, when the range of the closure rate is changed to 1 to 10% and the range of the total reflection is changed up to 1 to 30%, an effect of reducing the reflection by a maximum of 70% may be shown and an effect of reducing the total reflection by a minimum of 10% may be shown.

In the exemplary embodiment of the present application, the light reflection reducing pattern layer comprises a first surface contacting the metal pattern layer and a second surface facing the first surface. When the total reflection of the conductive structure body is measured at the second surface side of the light reflection reducing pattern layer, a difference between the total reflection Rt of the conductive structure body and the reflection Ro of the substrate may be 40% or less, 30% or less, 20% or less, and 10% or less.

In the exemplary embodiment of the present application, the conductive structure body may have a contrast value L* of 50 or less and more particularly 40 or less based on the Commission Internationale de l'Eclairage (CIE) L*a*b* color coordinate. There is an advantage in that as the contrast value is decreased, the reflection is decreased.

In the exemplary embodiment of the present application, there may be few pinholes in the conductive structure body, and even though the pinhole is present, a diameter thereof may be 3 μm or less and more particularly 1 μm or less. When the diameter of the pinhole in the conductive structure body is 3 μm or less, disconnection may be prevented from occurring. Further, since there are few pinholes in the conductive structure body, when the number of pinholes is too small, disconnection may be prevented from occurring.

In the exemplary embodiment of the present application, the light reflection reducing layer may be patterned simultaneously with or separately from the metal layer.

In the exemplary embodiment of the present application, the patterned light reflection reducing layer and the patterned metal layer may form a stacked structure simultaneously or separately by a patterning process. In this aspect, the stacked structure may be distinguished from a structure in which at least some of a light absorbing material is dented or dispersed in a conductive pattern or a structure in which a par of the surface is physically or chemically modified by additional surface treatment of a conductive pattern of a single layer.

Further, in the exemplary embodiment of the present application, the light reflection reducing layer may be directly provided on the substrate or the metal layer without interposing a bonding layer or an adhesive layer. The bonding layer or the adhesive layer may have an effect on durability or an optical property. Further, a method for manufacturing the conductive structure body according to the exemplary embodiment of the present application is completely different from the case of using the bonding layer or the adhesive layer. Further, as compared with the case of using the bonding layer or the adhesive layer, the conductive structure body according to the exemplary embodiment of the present application has an excellent interface characteristic between the substrate or the metal layer and the light reflection reducing layer.

In the exemplary embodiment of the present application, the light reflection reducing layer may be formed by a single layer or two or more multilayer.

In the exemplary embodiment of the present application, the light reflection reducing layer may have an achromatic color. In this case, the achromatic color means a color displayed when light incident to the surface of an object is not selectively absorbed, but evenly reflected and absorbed at a wavelength of each component.

In the exemplary embodiment of the present application, the light reflection reducing layer may further comprise at least one of a dielectric material and a metal. The metal may be a metal or a metal alloy. The dielectric material may comprise $TiO_{2-x}$, $SiO_{2-x}$, $MgF_{2-x}$, and $SiN_{1.3-x}$, ($-1 \leq x \leq 1$), but is not limited thereto. The metal may be alloys of two or more metals selected from iron (Fe), cobalt (Co), titanium (Ti), vanadium (V), aluminum (Al), molybdenum (Mo), copper (Cu), gold (Au), and silver (Ag) and may be an alloy of two or more metals selected from iron (Fe), cobalt (Co), titanium (Ti), vanadium (V), aluminum (Al), molybdenum (Mo), copper (Cu), gold (Au), and silver (Ag), but is not limited thereto.

In the exemplary embodiment of the present application, the light reflection reducing layer comprises copper-manganese-nickel oxide represented by $Cu_xMn_yNi_pO_q$ and may further comprise at least one of the dielectric materials and the metals.

In the exemplary embodiment of the present application, as external light is farther away from the incident direction, the dielectric material may be distributed to be gradually decreased and the metal and alloy components may be distributed reversely. In this case, the content of the dielectric material may be 20 to 50 wt % and the content of the metal may be 50 to 80 wt %. When the light reflection reducing layer further comprises the alloy, the light reflection reducing layer may comprise a dielectric material of 10 to 30 wt %, a metal of 50 to 80 wt %, and an alloy of 5 to 40 wt %.

As another detailed example, the light reflection reducing layer may further comprise at least one of an alloy of nickel and vanadium, and oxide, nitride, or oxynitride of nickel and vanadium. In this case, the vanadium is contained with 26 to 52 at % and an atom ratio of vanadium to nickel may be 26/74 to 52/48.

As another detailed example, the light reflection reducing layer may further comprise a transition layer which has two or more elements and has a composition ratio of one element which is increased by a maximum of about 20% per 100Ω in an incident direction of external light. In this case, one element may be a metal element such as nickel (Ni), vanadium (V), tungsten (W), tantalum (Ta), molybdenum (Mo), niobium (Nb), titanium (Ti), iron (Fe), chromium (Cr), cobalt (Co), aluminum (Al) or copper (Cu), and an element other than the metal element may be oxygen, nitrogen, or carbon.

As another detailed example, the light reflection reducing layer may further comprise a first chromium oxide layer, a metal layer, a second chromium oxide layer, a chromium mirror. In this case, the light reflection reducing layer may comprise a metal selected from nickel (Ni), vanadium (V), tungsten (W), tantalum (Ta), molybdenum (Mo), niobium (Nb), titanium (Ti), iron (Fe), cobalt (Co), aluminum (Al) and copper (Cu) instead of chromium. The metal layer may have a thickness of 10 nm to 30 nm, the first chromium oxide layer may have a thickness of 35 nm to 41 nm, and the second chromium oxide layer may have a thickness of 37 nm to 42 nm.

As another detailed example, the light reflection reducing layer may use a stacked structure of an alumina ($Al_2O_3$) layer, a chromium oxide ($Cr_2O_3$) layer, and a chromium (Cr) layer. Herein, the alumina layer has an improved reflective characteristic and a light diffusion prevention characteristic, and the chromium oxide layer may reduce a reflection of a mirror surface to improve a contrast characteristic.

In the exemplary embodiment of the present application, the material of the metal layer may be preferably a material having a specific resistance of $1 \times 10^{-6}$ Ω·cm to $30 \times 10^{-6}$ Ω·m and more preferably $1 \times 10^{-6}$ Ω·cm to $7 \times 10^6$ Ω·cm.

In the conductive structure body according to the exemplary embodiment of the present application, a material of the metal layer may be a metal material having excellent electric conductivity and easy etching. However, generally, there is a disadvantage in that a material having excellent electric conductivity has high reflectivity. However, in the present application, the light reflection reducing layer is used to form the metal layer using a material having high reflectivity. In the present application, even in the case of using a material having reflectivity of 70% or more or 80% or more, the light reflection reducing layer is added to reduce reflectivity, improve concealment of the metal layer, and maintain or improve a contrast characteristic.

In the exemplary embodiment of the present application, the metal layer may be a single layer or a multilayer.

In the exemplary embodiment of the present application, a detailed example of the material of the metal layer may comprise one or two or more selected from the group consisting of copper (Cu), aluminum (Al), silver (Ag), neodymium (Nd), molybdenum (Mo), nickel (Ni), and alloys thereof. More particularly, the material of the metal layer may comprise molybdenum, aluminum, or copper. Much more particularly, the material of the metal layer may comprise copper. When the metal layer comprises copper, since the same metal as the light reflection reducing layer is comprised, there is an advantage on a process in that processing is enabled by using the same etchant and it is advantageous even in terms of the production speed, and thus, it is advantageous in the manufacturing process.

When the metal layer comprises copper, if the light reflection reducing layer comprises copper-manganese-nickel oxide represented by $Cu_xMn_yNi_pO_q$, batch etching is enabled and thus, in the production process, there is an advantage in that efficiency is high, costs are reduced and it is economical. Further, copper has a specific resistance value of $1.7 \times 10^{-6}$ Ω·cm and is more advantageous than Al having a specific resistance value of $2.8 \times 10^{-6}$ Ω·cm. Therefore, there is an advantage in that in order to satisfy a surface resistance value of more than 0 Ω/sq and 2 Ω/sq or less and preferably more than 0 Ω/sq and 0.7 Ω/sq or less, the thickness of the metal layer may be formed to be smaller than the thickness of Al. The surface resistance may be adjusted depending on a thickness of the metal layer. For example, in order to satisfy a surface resistance of 0.6 Ω/sq to 0.7 Ω/sq, in the case of Al, the thickness needs to be 80 nm to 90 nm and in the case of Cu, the thickness needs to be 55 nm to 65 nm, and thus, it is economic in that the thickness of the layer may be smaller. Further, since Cu has an excellent yield of about three times larger than Al in a sputtering process, theoretically, it may be expected to improve a deposition rate by three times as much. Accordingly, the conductive layer comprising Cu has excellent advantages of high efficiency and being economic in the production process.

In the exemplary embodiment of the present application, the thickness of the light reflection reducing layer may be particularly 0.1 nm or more and 400 nm or less. The thickness of the light reflection reducing layer may be more particularly 0.1 nm or more and 100 nm or less and much more particularly 0.1 nm or more and 60 nm or less. In the light reflection reducing layer, a preferable thickness may vary according to a manufacturing process in a range of 0.1 nm or more and 400 nm or less, but by considering an etching characteristic, when the thickness is 0.1 nm or more, process control is relatively easy and when the thickness is 60 nm or less, it may be relatively advantageous in terms of the process control and the production rate. When the thickness of the light reflection reducing layer is 0.1 nm or more and 400 nm or less, more particularly 0.1 nm or more and 100 nm or less, and much more particularly 0.1 nm or more and 60 nm or less, an average reflection may be 20% or less, particularly 15% or less, and more particularly 10% or less in a visible light wavelength range of 380 nm to 780 nm and thus, a light reflection reducing effect is excellent.

In the exemplary embodiment of the present application, the thickness of the metal layer is not particularly limited, but when the thickness of the metal layer is 0.01 μm or more and 10 μm or less, a better effect may be exhibited in terms of conductivity of the metal layer and economic efficiency of the pattern forming process.

In the exemplary embodiment of the present application, a line width of the pattern in the metal pattern layer may be 10 μm or less. In this case, the light reflection reducing layer may have a pattern having the same shape as the metal layer. However, a pattern scale of the light reflection reducing pattern layer needs not to be completely the same as that of the metal pattern layer, and a case where the line width of the pattern in the light reflection reducing pattern layer is smaller or larger than the line width of the pattern in the metal pattern layer is also comprised in the scope of the present application. Particularly, the line width of the pattern in the light reflection reducing pattern layer may be 80% or more and 120% or less of the line width of the pattern in the metal pattern layer. Further, an area provided with the pattern in the light reflection reducing pattern layer may be particularly 80% or more and 120% or less of an area provided with the pattern in the metal pattern layer. More particularly, a pattern shape of the light reflection reducing pattern layer may be a pattern shape having a line width which is equal to or larger than the line width of the pattern of the metal pattern layer.

When the light reflection reducing pattern layer has a pattern shape having a line width which is larger than the line width of the metal pattern layer, the light reflection reducing pattern layer may largely give an effect of covering the metal pattern layer when viewed from the user, and thus, there is an advantage in that an effect by luster or reflection of the metal pattern layer itself may be efficiently blocked. However, even though the line width of the pattern in the light reflection reducing pattern layer is the same as the line width of the pattern in the metal pattern layer, the present application may achieve a desired effect.

In the exemplary embodiment of the present application, the substrate may use a transparent substrate, but is not particularly limited, and for example, the substrate may use glass, a plastic substrate, a plastic film, and the like.

In the exemplary embodiment of the present application, the line width of the pattern in the metal pattern layer may be more than 0 μm and 10 μm or less, particularly 0.1 μm or more and 10 μm or less, more particularly 0.2 μm or more and 8 μm or less, and much more particularly 0.5 μm or more and 5 μm or less.

In the exemplary embodiment of the present application, an aperture ratio of the metal pattern layer, that is, an area ratio which is not covered by the pattern may be 70% or more, 85% or more, and 95% or more. Further, the aperture ratio of the metal pattern layer may be 90 to 99.9%, but is not limited thereto.

In the exemplary embodiment of the present application, the pattern of the metal pattern layer may be a regular pattern and an irregular pattern.

As the regular pattern, a pattern form in the art such as a mesh pattern may be used. The irregular pattern is not particularly limited, but may be a boundary line form of figures configuring a Voronoi diagram. In the present application, in the case of using the irregular pattern and the patterned light reflection reducing layer together, a diffractive pattern of reflective light by directional lighting may be removed by the irregular pattern and an effect by scattering of light may be minimized by the light reflection reducing pattern layer, thereby minimizing the problem of visibility.

An example of the conductive structure body according to the exemplary embodiment of the present application is illustrated in FIGS. 1 to 6.

Figure 1:
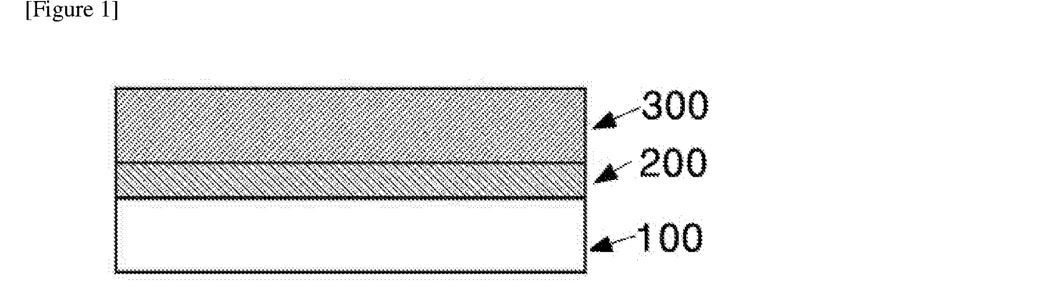
FIGS. 1 to 3 are diagrams illustrating a stacked structure of a conductive structure body comprising a metal layer and a light reflection reducing layer according to an exemplary embodiment of the present application, respectively.
Figure 2:
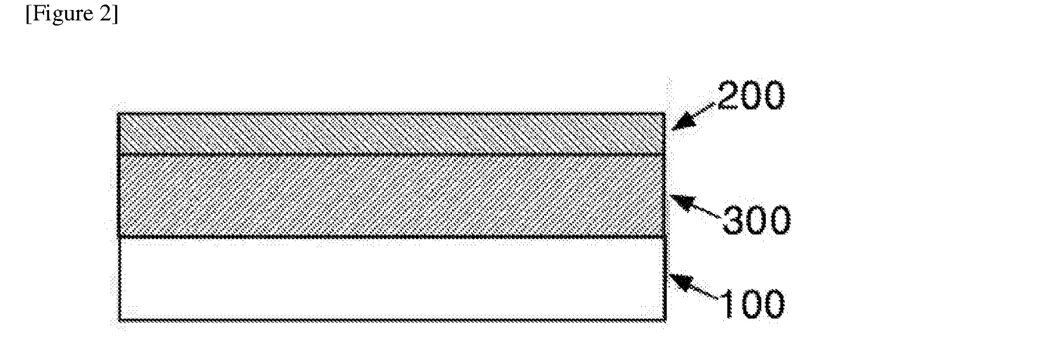
Figure 3:
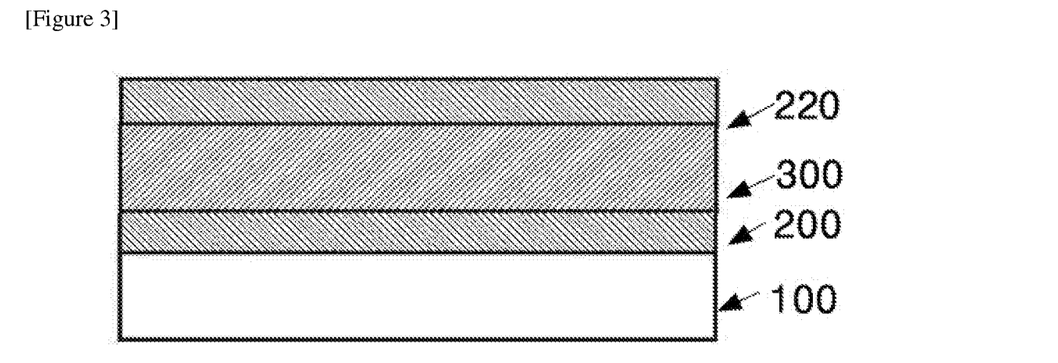

FIGS. 1 to 3 illustrate a stacking order of the substrate, the metal layer and the light reflection reducing layer, and the metal layer and the light reflection reducing layer may have pattern shapes rather than the entire surface layer when being actually applied for a fine transparent electrode of the touch screen panel and the like.

Referring to FIG. 1, it is illustrated that a light reflection reducing layer 200 is disposed between a substrate 100 and a metal layer 300. When a user views the touch screen panel from the substrate side, the reflectivity by the metal layer may be largely reduced.

Referring to FIG. 2, it is illustrated that the light reflection reducing layer 200 is disposed on the metal layer 300. When a user views the touch screen panel from an opposite surface of the substrate side, the reflectivity by the metal layer may be largely reduced.

Referring to FIG. 3, it is illustrated that the light reflection reducing layers 200 and 220 all are disposed between the substrate 100 and the metal layer 300 and on the metal layer 300. When the user views the touch screen panel from both the substrate side and the opposite side thereof, the reflectivity by the conductive layer may be largely reduced.

In the description of FIGS. 1 to 3, the conductive layer may be a patterned metal layer and the light reflection reducing layer may be a patterned light reflection reducing layer.

Figure 4:
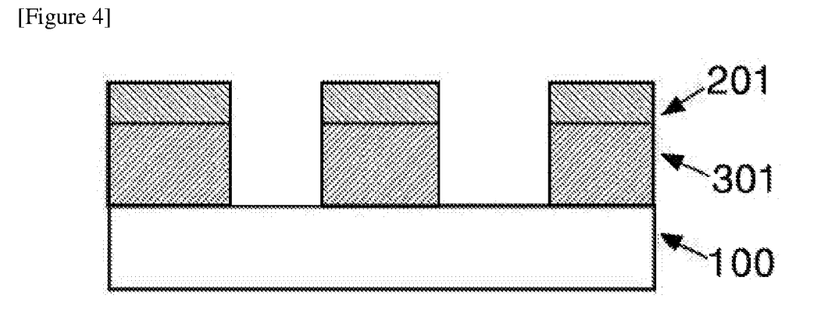
FIGS. 4 to 6 are diagrams illustrating a stacked structure of a conductive structure body comprising a metal pattern layer and a light reflection reducing pattern layer according to another exemplary embodiment of the present application, respectively.
Figure 5:
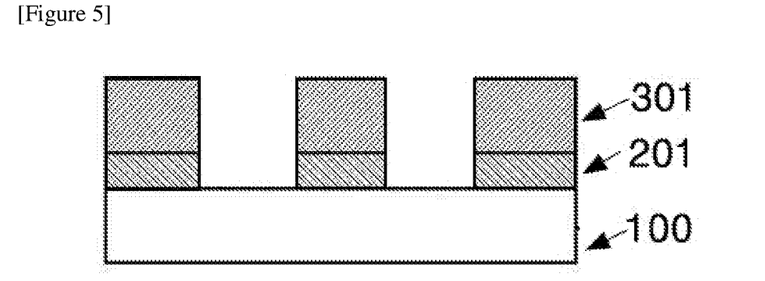
Figure 6:
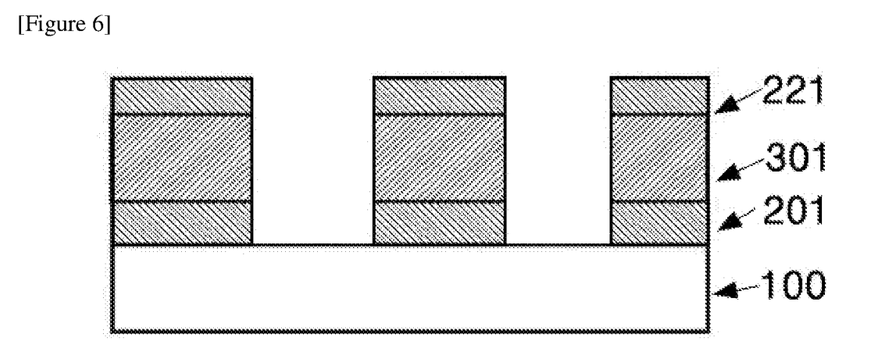

FIGS. 4 to 6 are diagrams illustrating a stacked structure of a conductive structure body comprising a metal pattern layer and a light reflection reducing pattern layer according to another exemplary embodiment of the present application, respectively.

In a structure of the conductive structure body according to the exemplary embodiment of the present application, the light reflection reducing layer may be provided on at least one surface of the metal layer.

The structure of the conductive structure body according to the exemplary embodiment of the present application may be a structure in which the substrate, the light reflection reducing layer, the metal layer, and the light reflection reducing layer are sequentially stacked. Further, the conductive structure body may further comprise a metal layer and a light reflection reducing layer on the outermost light reflection reducing layer. That is, the structure of the conductive structure body according to the exemplary embodiment of the present application may be selected from the group consisting of a structure of substrate/light reflection reducing layer/metal layer, a structure of substrate/metal layer/light reflection reducing layer, a structure of substrate/light reflection reducing layer/metal layer/light reflection reducing layer, a structure of substrate/metal layer/light reflection reducing layer/metal layer, a structure of substrate/light reflection reducing layer/metal layer/light reflection reducing layer metal layer/light reflection reducing layer, a structure of substrate/metal layer/light reflection reducing layer/metal layer/light reflection reducing layer/metal layer, a structure of substrate/light reflection reducing layer/metal layer/light reflection reducing layer/metal layer/light reflection reducing layer/metal layer, a structure of substrate/metal layer/light reflection reducing layer/metal layer/light reflection reducing layer/metal layer/light reflection reducing layer, a structure of substrate/light reflection reducing layer/metal layer/light reflection reducing layer/metal layer/light reflection reducing layer/metal layer/light reflection reducing layer, and a structure of substrate/metal layer/light reflection reducing layer/metal layer/light reflection reducing layer/metal layer light reflection reducing layer/metal layer.

In the description, the metal layer may be a metal pattern layer and the light reflection reducing layer may be a light reflection reducing pattern layer.

A method for manufacturing a conductive structure body according to the exemplary embodiment of the present application comprises forming a metal layer on a substrate; and forming a light reflection reducing layer provided on at least one surface of the metal layer and comprising copper-manganese-nickel oxide, in which the copper content is 10 to 50 at %, the manganese content is 0.1 to 16 at %, the nickel content is 0.1 to 28 at %, and the oxygen content is 30 to 80 at % in the light reflection reducing layer.

The manufacturing method may further comprise patterning the metal layer and the light reflection reducing layer separately or simultaneously. Particularly, after the metal layer is formed, the metal layer may be patterned and after the light reflection reducing layer is formed, the light reflection reducing layer may be patterned. Further, particularly, after the forming of the light reflection reducing layer, the metal layer and the light reflection reducing layer may be patterned simultaneously.

In the method for manufacturing the conductive structure body, the surface resistance of the metal layer or the light reflection reducing layer before patterning may be more than 0 Ω/sq and 2 Ω/sq or less and preferably more than 0 Ω/sq and 0.7 Ω/sq or less. When the surface resistance is 2 Ω/sq or less, particularly, 0.7 Ω/sq or less, as the surface resistance of the metal layer or the light reflection reducing layer before patterning is lowered, a fine patterning design and a manufacturing process are easily performed, and the surface resistance of the conductive structure body after patterning is lowered and thus, there is an effect of increasing a reaction rate of the electrode.

In the method for manufacturing the conductive structure body, the description for the conductive structure body, the metal layer, and the light reflection reducing layer is as described above.

In the exemplary embodiment of the present application, the metal layer and the light reflection reducing layer may be formed by using a method known in the art. For example, the metal layer and the light reflection reducing layer may be formed by a method such as deposition, sputtering, wet coating, evaporation, electroplating or electroless plating, and lamination of a metal film and particularly, may be formed by a reactive sputtering method.

For example, in the case of forming a metal layer containing Cu and a light reflection reducing layer containing copper-manganese-nickel oxide, the process may be performed by controlling partial pressure of reactive gas such as $O_2$ by using the reactive sputtering method.

In the exemplary embodiment of the present application, the patterning of the metal layer and the light reflection reducing layer may be performed by a method of using an etching resist pattern. The etching resist pattern may be formed by using a printing method, a photolithography method, a photography method, a method using a mask, or laser transfer, for example, thermal transfer imaging, and the like and more preferably a printing method or a photolithography method, but the present application is not limited thereto. The metal layer and the light reflection reducing layer are etched and patterned by using the etching resist pattern, and the etching resist pattern may be easily removed by a strip process.

An exemplary embodiment of the present application provides a touch screen panel comprising the conductive structure body. For example, in a capacitive touch screen panel, the conductive structure body according to the exemplary embodiment of the present application may be used as a touch sensitive electrode substrate.

An exemplary embodiment of the present application provides a display device comprising the touch screen panel.

The touch screen panel according to the exemplary embodiment of the present application may further comprise additional structure bodies in addition to the conductive structure body comprising the substrate, the metal pattern layer, and the light reflection reducing pattern layer described above. In this case, the two structure bodies may be disposed in the same direction, or may be disposed in directions opposite to each other. Two or more structure bodies that may be comprised in the touch screen panel of the present application need not to have the same structure, and any one, preferably, only a structure body which is closest to the user may comprise the substrate, the metal pattern layer, and the light reflection reducing pattern layer described above, and the additional structure body may not comprise the light reflection reducing pattern layer. Further, layer-stacked structures in the two or more structure bodies may be different from each other. When two or more structure bodies are comprised, an insulating layer may be provided therebetween. In this case, the insulating layer may additionally have a function of an adhesive layer.

The touch screen panel according to the exemplary embodiment of the present application may comprise a lower substrate; an upper substrate; and electrode layers provided on any one surface or both surfaces of a surface of the lower substrate contacting the upper substrate and a surface of the upper substrate contacting the lower substrate. The electrode layers may perform a function for detecting an X-axial position and a Y-axial position, respectively.

In this case, one or two of the electrode layers provided on the lower substrate and the surface of the lower substrate contacting the upper substrate; and the electrode layers provided on the upper substrate and the surface of the upper substrate contacting the lower substrate may be the conductive structure body according to the aforementioned exemplary embodiment of the present application. In the case where only any one of the electrode layers is the conductive structure body according to the present application, the other electrode layer may have a conductive pattern which is known in the art.

In the case where the electrode layers are provided on one surfaces of both the upper substrate and the lower substrate to form an electrode layer of two layers, an insulating layer or a spacer may be provided between the lower substrate and the upper substrate so that a distance between the electrode layers is uniformly maintained and the electrode layers are not connected to each other. The insulating layer may comprise an adhesive agent or a UV or thermosetting resin. The touch screen panel may further comprise a ground portion connected to the pattern of the conductive layer of the aforementioned conductive structure body. For example, the ground portion may be formed at an edge of the surface with the pattern of the conductive layer of the substrate. Further, at least one of an anti-reflective film, a polarization film, and an anti-fingerprinting film may be provided on at least one surface of a laminate comprising the conductive structure body. According to a design specification, different types of functional films may further be comprised in addition to the aforementioned functional films. As described above, the touch screen panel may be applied to display devices such as an OLED display panel, a liquid crystal display (LCD), a cathode-ray tube (CRT), and a PDP.

In the touch screen panel according to the exemplary embodiment of the present application, the metal pattern layer and the light reflection reducing pattern layer may be provided on two surfaces of the substrate, respectively.

The touch screen panel according to the exemplary embodiment of the present application may additionally comprise an electrode portion or a pad portion on the conductive structure body. In this case, an effective screen portion, the electrode portion, and the pad portion may be configured by the same conductor.

In the touch screen panel according to the exemplary embodiment of the present application, the light reflection reducing pattern layer may be provided at a side which is viewed by the user.

An exemplary embodiment of the present application provides a display device comprising the conductive structure body. In the display device, the conductive structure body according to the exemplary embodiment of the present application may be used in a color filter substrate, a thin film transistor substrate, or the like.

An exemplary embodiment of the present application provides a solar cell comprising the conductive structure body. For example, the solar cell may comprise an anode electrode, a cathode electrode, a photoactive layer, a hole transporting layer and/or an electron transporting layer, and the conductive structure body according to the exemplary embodiment of the present application may be used as the anode electrode and/or the cathode electrode.

The conductive structure body may replace conventional ITO in the display device or the solar cell and may be used as a flexible application. Further, the conductive structure body may be used as a next-generation transparent electrode together with CNT, a conductive polymer, graphene, or the like.

Hereinafter, the present application will be described in more detail with reference to Examples, Comparative Examples, and Experimental Examples. However, Examples below are to just exemplify the present application and the scope of the present application is not limited thereto.

EXAMPLES

Examples 1 to 3

After a polyethylene terephthalate (PET) substrate was prepared, a metal layer having a thickness of 100 nm was formed on the PET substrate using Cu as a source material under an argon atmosphere of 2 mTorr. Further, a light reflection reducing layer was formed on the metal layer by a sputtering method using Cu—Mn—Ni as a source material under an atmosphere of 3 mTorr with oxygen partial pressure of 29%, 50%, 70% or 100%. Particularly, a conductive structure body was manufactured by forming the light reflection reducing layer made of copper-manganese-nickel oxide having a thickness of 30 nm on the metal layer by varying the contents of Mn and Ni of the source material as illustrated in Table 1 below.

Comparative Example 1

After a polyethylene terephthalate (PET) substrate was prepared, a metal layer having a thickness of 100 nm was formed on the PET substrate using Cu as a source material under an argon atmosphere of 2 mTorr. Further, a light reflection reducing layer was formed on the metal layer by a sputtering method using Cu—Mn as a source material under an atmosphere of 3 mTorr with oxygen partial pressure of 70%. Particularly, a conductive structure body was manufactured by forming the light reflection reducing layer made of copper-manganese oxide having a thickness of 30 nm on the metal layer as illustrated in Table 1 below.

Comparative Example 2

After a polyethylene terephthalate (PET) substrate was prepared, a metal layer having a thickness of 100 nm was formed on the PET substrate using Cu as a source material under an argon atmosphere of 2 mTorr. Further, a light reflection reducing layer was formed on the metal layer by a sputtering method using Cu—Ni as a source material under an atmosphere of 3 mTorr with oxygen partial pressure of 70%. Particularly, a conductive structure body was manufactured by forming the light reflection reducing layer made of copper-nickel oxide having a thickness of 30 nm on the metal layer as illustrated in Table 1 below.

The Example and the Comparative Examples were used for determining performance of the conductive structure body, and thus, a patterning process was omitted.

TABLE 1

| | Oxygen partial pressure (%) | Atomic (%) | | | |
|---|---|---|---|---|---|
| | | O | Mn | Ni | Cu |
| Example 1 | 29 | 34 | 8 | 20 | 38 |
| Example 2 | 50 | 52 | 3 | 17 | 28 |
| Example 3 | 100 | 52 | 3 | 17 | 28 |
| Comparative Example 1 | 100 | 52 | 3 | — | 45 |
| Comparative Example 2 | 100 | 53 | — | 29 | 18 |

Figure 7:
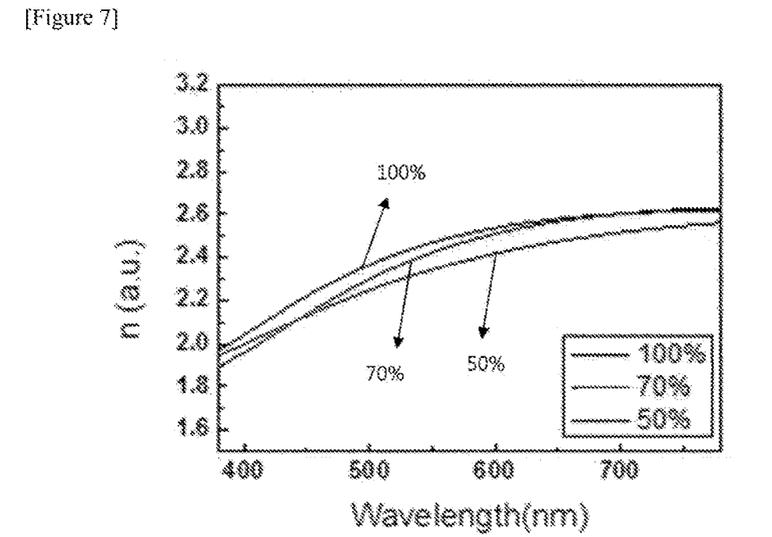
FIG. 7 illustrates measurement of refractive indexes n of light reflection reducing layers of conductive structure bodies manufactured according to Examples and Comparative Examples, as an exemplary embodiment of the present application.

FIG. 7 illustrates measurement of refractive indexes n of light reflection reducing layers of conductive structure bodies manufactured according to the Examples and the Comparative Examples.

Figure 8:
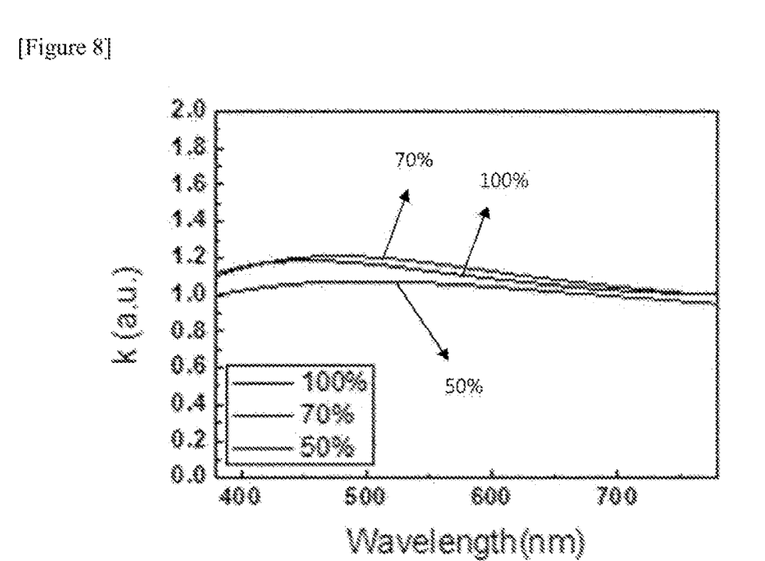
FIG. 8 illustrates measurement of extinction coefficients k of light reflection reducing layers of conductive structure bodies manufactured according to Examples and Comparative Examples, as an exemplary embodiment of the present application.

FIG. 8 illustrates measurement of extinction coefficients k of light reflection reducing layers of conductive structure bodies manufactured according to the Examples and the Comparative Examples.

In FIGS. 7 and 8, % means oxygen partial pressure (%) in Table 1 above.

<Experimental Example 1> Heat Resistance Test

1) Change in Surface Color of Light Reflection Reducing Layer

Figure 9:
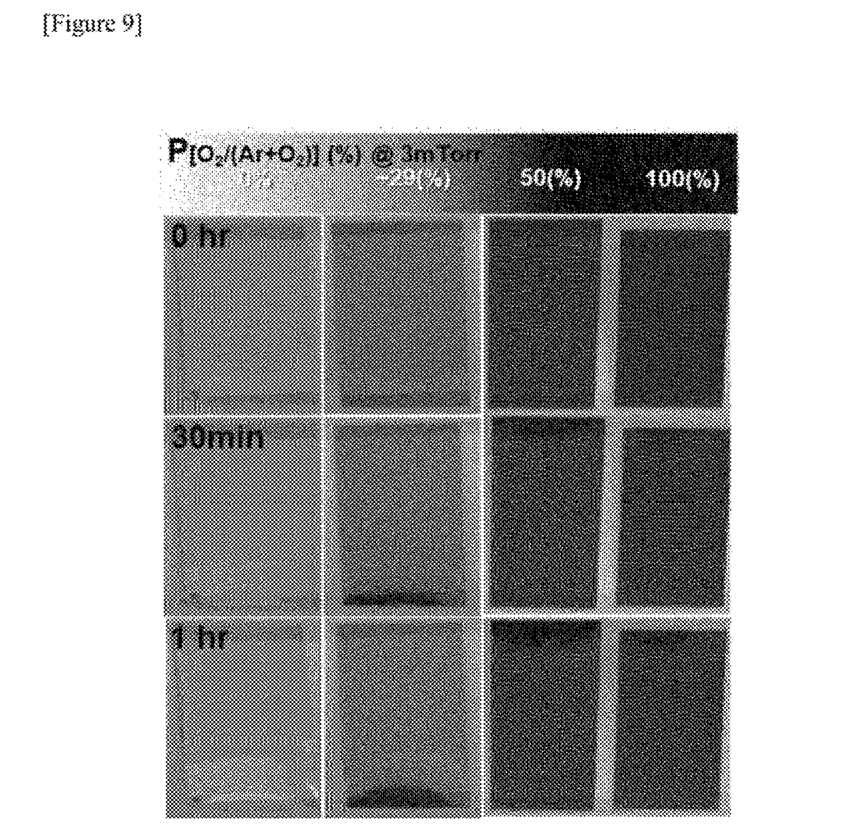
FIG. 9 illustrates a color change of the light reflection reducing layer of the conductive structure body before and after a heat resistance test, as an exemplary embodiment of the present application.

After the conductive structure body according to the Example was left for 1 hour in a high-temperature atmosphere of 150° C., a change in surface color of the light reflection reducing layer was observed, and the result was illustrated in FIG. 9.

Like the result of FIG. 9, even in the high-temperature atmosphere, it can be seen that the surface color of the light reflection reducing layer of the conductive structure body according to the present application is maintained without change.

2) Evaluation of Reflection

Figure 10:
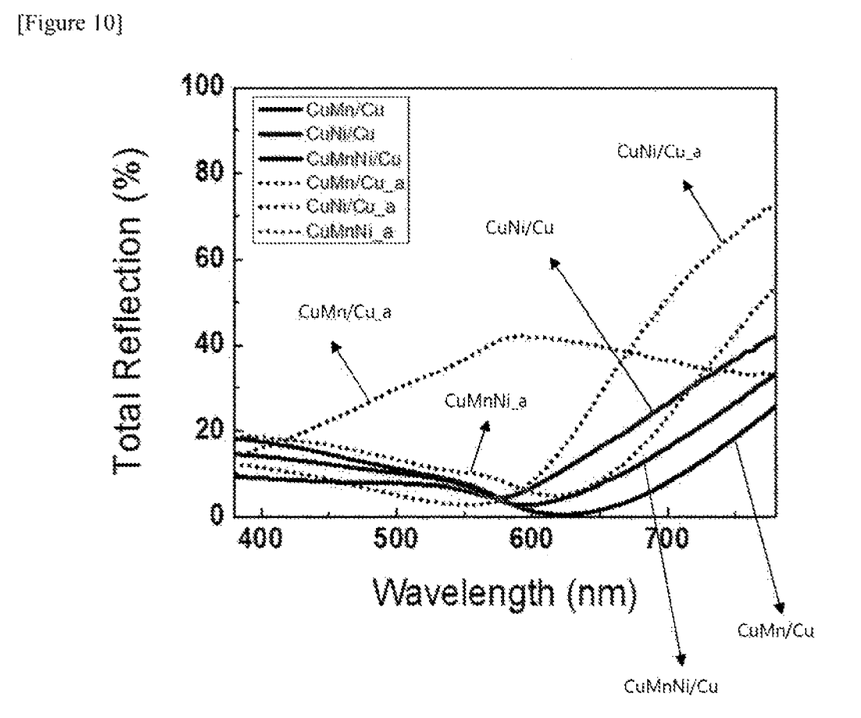
FIG. 10 illustrates a reflection of the conductive structure body before and after a heat resistance test, as an exemplary embodiment of the present application.

After the conductive structure bodies manufactured according to the Examples and Comparative Examples were left for 24 hours in a high-temperature atmosphere of 150° C., changes in reflection in a wavelength range of 380 nm to 780 nm were measured and the result was illustrated in FIG. 10.

Like the result of FIG. 10, it can be seen that the conductive structure body of Comparative Example 1 has a reflection reducing effect, but a heat resistance characteristic is relatively deteriorated. Further, the conductive structure body of Comparative Example 2 has a heat resistance characteristic effect, but has a problem that reflection is relatively high.

In the conductive structure body according to the exemplary embodiment of the present application, copper-manganese-nickel oxide comprising Cu, Mn and Ni simultaneously is applied to the light reflection reducing layer, thereby decreasing the reflection and having an excellent heat resistance characteristic.

3) Crystal Phase Comparison (XRD)

Figure 11:
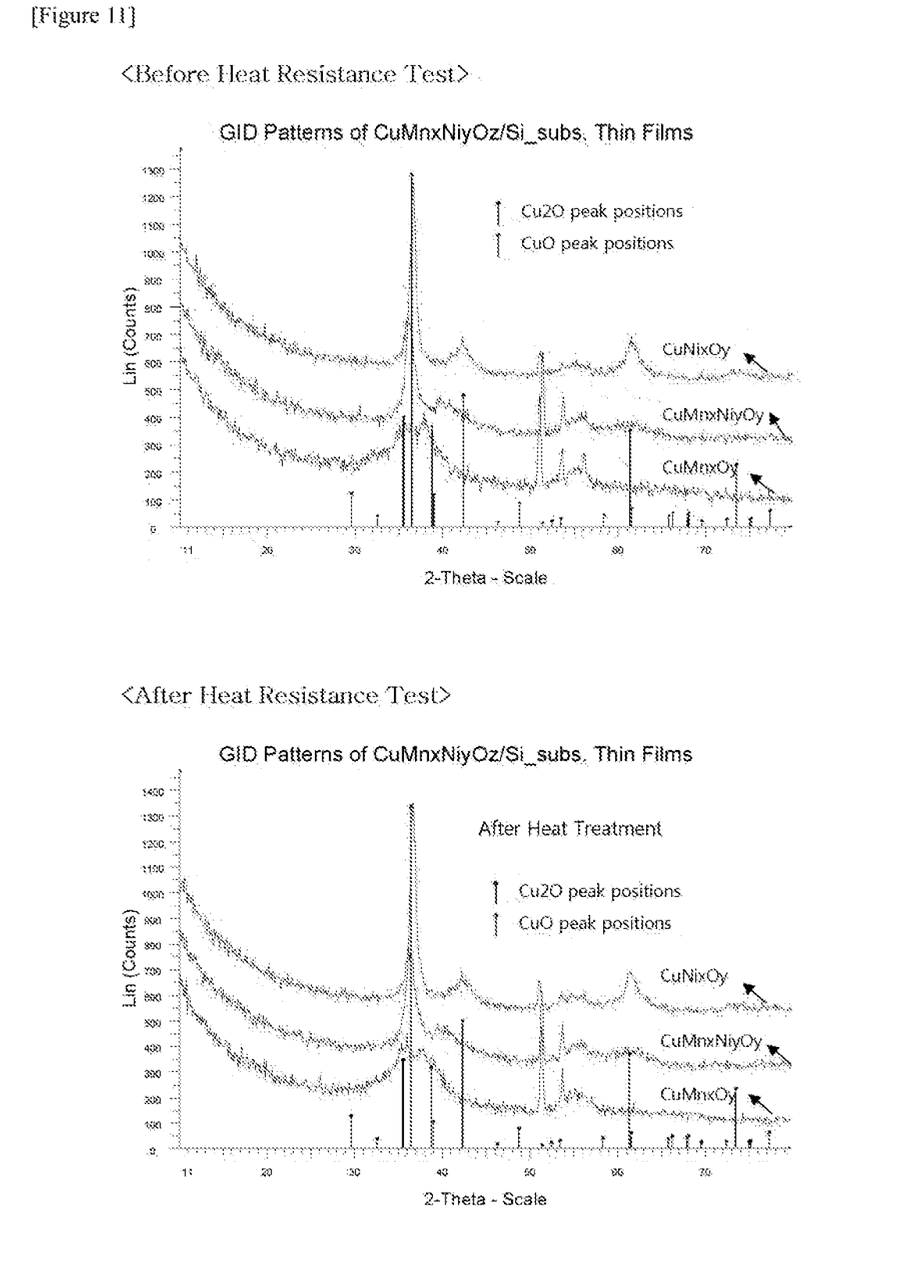
FIG. 11 is a diagram comparing crystal phases of the light reflection reducing layer of the conductive structure body before and after a heat resistance test, as an exemplary embodiment of the present application.

After the conductive structure bodies according to the Examples and Comparative Examples were left for 1 hour in a high-temperature atmosphere of 150° C., crystal phases (using an XRD) of the light reflection reducing layers were compared with each other, and the result was illustrated in FIG. 11.

Like the result of FIG. 11, it can be seen that before a heat resistance test, the light reflection reducing layer according to Comparative Example 1 has a crystal phase which is close to a CuO type, but the light reflection reducing layer according to the Example of the present application has a crystal phase which is close to a $Cu_2O$ type. Further, it can be seen that there is no change of the entire crystal phase after the heat resistance test.

As described above, the conductive structure body according to the exemplary embodiment of the present application has advantages of maintaining excellent electric conductivity and efficiently preventing a glaring effect of the metal layer. Further, the conductive structure body according to the exemplary embodiment of the present application has advantages of having excellent visibility and excellent chemical durability and physical durability.

Further, the conductive structure body according to the exemplary embodiment of the present application can minimize deterioration of electric conductivity of the conductive structure body according to a process environment in the case of being applied to an electronic device such as a display device. Further, the conductive structure body according to the exemplary embodiment of the present application may implement a fine line width and improve visibility.

Therefore, the conductive structure body according to the exemplary embodiment of the present application does not influence the conductivity of the metal layer and may prevent reflection by the metal layer and improve concealment of the metal layer by improving an absorbance. Further, it is possible to develop touch screen panels with improved visibility, and display devices and solar cells comprising the same by using the conductive structure body according to the exemplary embodiment of the present application.

The invention claimed is:

1. A touch screen panel comprising a conductive structure body,
wherein the conductive structure body comprises:
a substrate;
a metal layer provided on the substrate; and
a light reflection reducing layer provided on at least one surface of the metal layer and consisting of copper-manganese-nickel oxide,
wherein the copper content is 28 to 46 at %, the manganese content is 3 to 12 at %, the nickel content is 17 to 24 at %, and the oxygen content is 18 to 52 at % in the light reflection reducing layer,
wherein a ratio of the oxygen content to the sum of the copper, manganese, nickel, and oxygen contents in the light reflection reducing layer is 0.18 to 0.52.

2. The touch screen panel of claim 1, wherein in light having a wavelength range of 380 nm to 780 nm, an extinction coefficient k of the light reflection reducing layer is 0.6 or more and 1.4 or less.

3. The touch screen panel of claim 1, wherein in light having a wavelength range of 380 nm to 780 nm, a refractive index n of the light reflection reducing layer is 1.7 or more and 2.8 or less.

4. The touch screen panel of claim 1, wherein a total reflection of the conductive structure body is 40% or less.

5. The touch screen panel of claim 1, wherein a thickness of the light reflection reducing layer is 0.1 to 400 nm.

6. The touch screen panel of claim 1, wherein a thickness of the light reflection reducing layer is 0.1 to 100 nm.

7. The touch screen panel of claim 1, wherein a thickness of the metal layer is 0.01 to 10 pm.

8. The touch screen panel of claim 1, wherein the metal layer comprises one or two or more selected from the group consisting of Cu, Al, Ag, Nd, Mo, Ni and alloys thereof.

9. The touch screen panel of claim 1, wherein the metal layer is a patterned metal pattern layer, and the light reflection reducing layer is a patterned light reflection reducing pattern layer.

10. The touch screen panel of claim 9, wherein a line width of the metal pattern layer is 10 μm or less.

11. The touch screen panel of claim 9, wherein a surface resistance of the conductive structure body is 1 Ω/sq to 300 Ω/sq.

\* \* \* \* \*